(12) United States Patent
Ishiyama

(10) Patent No.: US 11,322,452 B2
(45) Date of Patent: May 3, 2022

(54) SEMICONDUCTOR MODULE

(71) Applicant: Mitsubishi Electric Corporation, Tokyo (JP)

(72) Inventor: Yusuke Ishiyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 88 days.

(21) Appl. No.: 16/662,227

(22) Filed: Oct. 24, 2019

(65) Prior Publication Data

US 2020/0335445 A1 Oct. 22, 2020

(30) Foreign Application Priority Data

Apr. 19, 2019 (JP) .............................. JP2019-080267

(51) Int. Cl.
*H01L 23/538* (2006.01)
*H01L 23/31* (2006.01)
(Continued)

(52) U.S. Cl.
CPC ...... *H01L 23/5389* (2013.01); *H01L 23/3121* (2013.01); *H01L 23/492* (2013.01); *H01L 24/29* (2013.01); *H01L 2924/014* (2013.01)

(58) Field of Classification Search
CPC ........... H01L 23/49811; H01L 23/5385; H01L 29/66325; H01L 29/7393–7398;
(Continued)

(56) References Cited

U.S. PATENT DOCUMENTS

2011/0037166 A1* 2/2011 Ikeda ................. H01L 23/49537
257/712
2011/0309375 A1* 12/2011 Kato ..................... H01L 21/565
257/77

(Continued)

FOREIGN PATENT DOCUMENTS

JP 2013030710 A 2/2013
JP 2013-251569 A 12/2013
WO 2011/064841 A1 6/2011

OTHER PUBLICATIONS

An Office Action; "Notice of Reasons for Refusal", mailed by the Japanese Patent Office dated Mar. 15, 2022, which corresponds to Japanese Patent Application No. 2019-080267 and is related to U.S. Appl. No. 16/662,227; with English language translation.

*Primary Examiner* — Shahed Ahmed
*Assistant Examiner* — Khatib A Rahman
(74) *Attorney, Agent, or Firm* — Studebaker & Brackett PC

(57) ABSTRACT

A semiconductor module includes: a first insulating plate; a second insulating plate is arranged above the first insulating plate; a first semiconductor device provided on an upper surface of the first insulating plate; a second semiconductor device provided on a lower surface of the second insulating plate; an insulating substrate including a third insulating plate arranged between the first insulating plate and the second insulating plate, and a conductor provided on the third insulating plate and connected to the first and second semiconductor devices; and sealing resin sealing the first and second semiconductor devices and the insulating substrate, wherein a withstand voltage of the third insulating plate is lower than withstand voltages of the first and second insulating plates.

19 Claims, 4 Drawing Sheets

(51) Int. Cl.
*H01L 23/00* (2006.01)
*H01L 23/492* (2006.01)

(58) Field of Classification Search
CPC ............... H01L 23/5389; H01L 23/492; H01L 23/3121; H01L 23/3107; H01L 24/29; H01L 2924/014; H01L 23/5386; H01L 24/32; H01L 2224/291; H01L 2224/29139; H01L 2224/32238; H01L 2224/3224; H01L 2224/33181; H01L 2224/82385; H01L 2224/83424; H01L 2224/83447; H01L 25/071; H01L 23/051; H01L 23/3672; H01L 23/3677; H01L 23/3735; H01L 23/49894
See application file for complete search history.

(56) References Cited

U.S. PATENT DOCUMENTS

| | | | |
|---|---|---|---|
| 2012/0228757 A1 | 9/2012 | Kitami et al. | |
| 2015/0333043 A1* | 11/2015 | Masuda | H01L 25/07 361/783 |
| 2016/0027711 A1* | 1/2016 | Harada | H01L 23/3735 257/698 |
| 2016/0181232 A1* | 6/2016 | Inokuchi | H01L 23/5386 257/76 |
| 2017/0338176 A1* | 11/2017 | Tsuyuno | H01L 24/48 |
| 2018/0040593 A1* | 2/2018 | Zhou | H01L 23/5384 |
| 2019/0057928 A1* | 2/2019 | Kawashima | H01L 23/3737 |
| 2020/0303360 A1* | 9/2020 | Tokuyama | H01L 23/4922 |

* cited by examiner

SEMICONDUCTOR MODULE

BACKGROUND OF THE INVENTION

Field

The present invention relates to a semiconductor module to be used, for example, for control of a large current.

Background

For a semiconductor module in which first and second insulating substrates provided with semiconductor devices are arranged to face each other up and down and sealed with resin, a configuration in which a third insulating substrate is connected to the semiconductor devices inside the module has been proposed (see, for example, Japanese Patent Laid-Open No. 2013-30710).

SUMMARY

Conventionally, the third insulating substrate for insulating the inside of the module has been designed to have the same withstand voltage as the first and second insulating substrates that perform the insulation between the inside and outside of the module. Therefore, there has been a problem that the insulation withstand voltage of the third insulating substrate inside the module is set to a higher value than necessary, so that the thermal conductivity is lowered to deteriorate heat dissipation performance, and the material cost is high to cause increase of the cost.

The present invention has been made in order to solve the above-described problem, and has an object to provide a semiconductor module that is capable of enhancing the heat dissipation performance and reducing the cost.

A semiconductor module according to the present invention includes: a first insulating plate; a second insulating plate is arranged above the first insulating plate; a first semiconductor device provided on an upper surface of the first insulating plate; a second semiconductor device provided on a lower surface of the second insulating plate; an insulating substrate including a third insulating plate arranged between the first insulating plate and the second insulating plate, and a conductor provided on the third insulating plate and connected to the first and second semiconductor devices; and sealing resin sealing the first and second semiconductor devices and the insulating substrate, wherein a withstand voltage of the third insulating plate is lower than withstand voltages of the first and second insulating plates.

In the present invention, the withstand voltage of the third insulating plate that performs the insulation inside the module is set to be lower than the withstand voltages of the first and second insulating plates that perform the insulation between the inside and outside of the module. As a result, the heat conductivity of the insulating plate is increased and heat dissipation is improved. Thus, the material cost can be saved and the cost can be reduced.

Other and further objects, features and advantages of the invention will appear more fully from the following description.

DESCRIPTION OF EMBODIMENTS

A semiconductor module according to the embodiments of the present invention will be described with reference to the drawings. The same components will be denoted by the same symbols, and the repeated description thereof may be omitted.

First Embodiment

Figure 1:
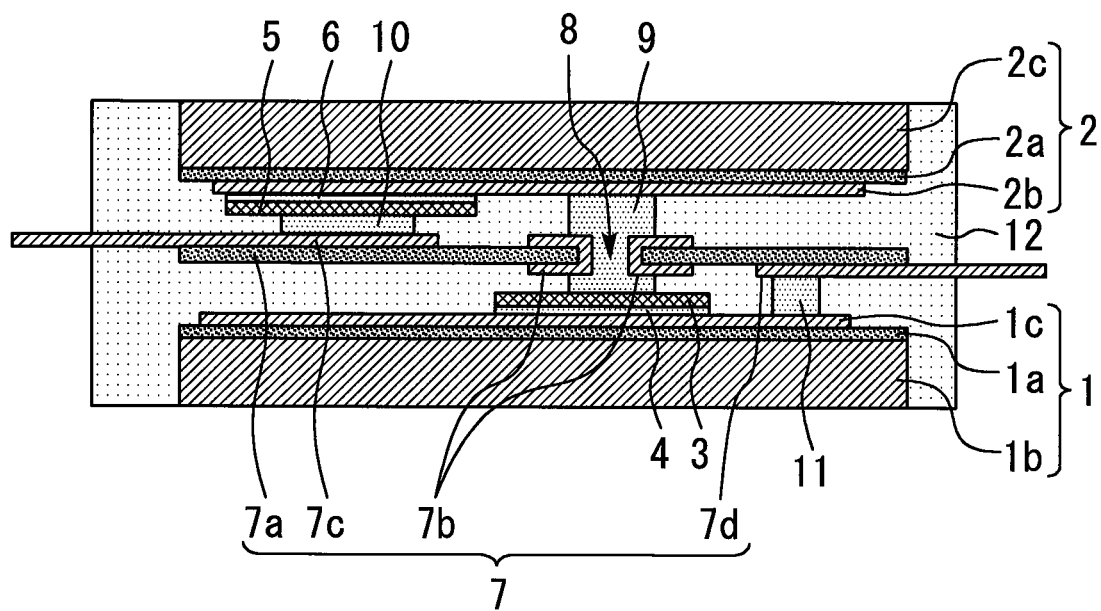
FIG. 1 is a cross-sectional view showing a semiconductor module according to a first embodiment.

FIG. 1 is a cross-sectional view showing a semiconductor module according to a first embodiment. An insulating substrate 1 includes an insulating plate 1a, a conductor 1b provided on the lower surface of the insulating plate 1a, and a conductor 1c provided on the upper surface of the insulating plate 1a. An insulating substrate 2 is arranged above the insulating substrate 1. The insulating substrate 2 includes an insulating plate 2a, a conductor 2b provided on the lower surface of the insulating plate 2a, and a conductor 2c provided on the upper surface of the insulating plate 2a. Note that in the present specification, a surface on an upper side in the cross-sectional view of FIG. 1 is referred to as "upper surface", and a surface on a lower side is referred to as "lower surface".

A semiconductor device 3 is provided on the upper surface of the insulating substrate 1. A lower electrode of the semiconductor device 3 is connected to the conductor 1c of the insulating substrate 1 by a brazing material 4. A semiconductor device 5 is provided on the lower surface of the insulating substrate 2. A lower electrode of the semiconductor device 5 is connected to the conductor 2b of the insulating substrate 2 by a brazing material 6.

Figure 2:
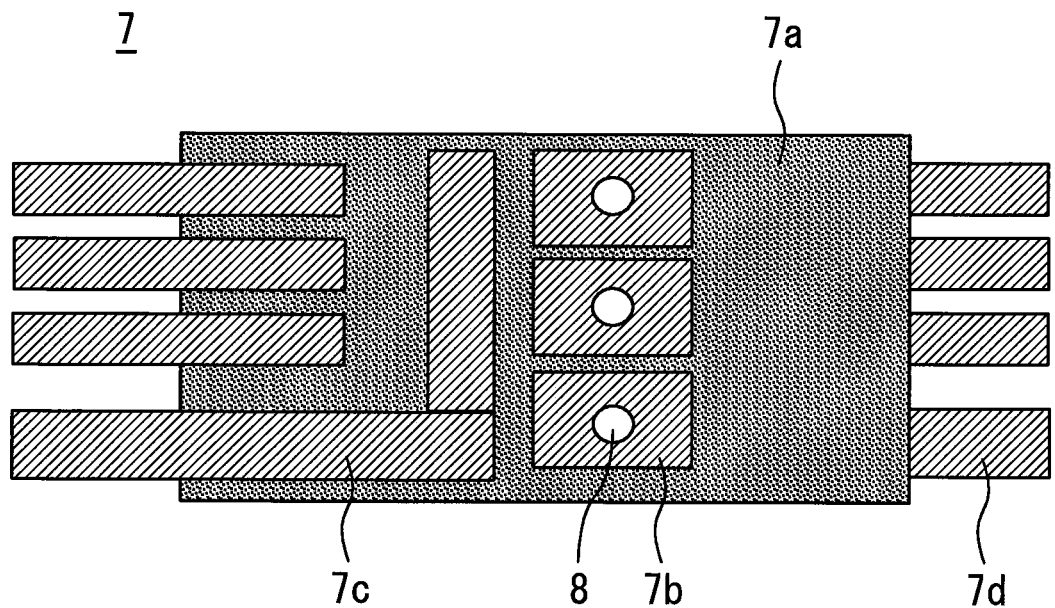
FIG. 2 is a top view showing the insulating substrate inside the module according to the first embodiment.

An insulating substrate 7 is arranged between the insulating substrate 1 and the insulating substrate 2. The insulating substrate 7 includes an insulating plate 7a and conductors 7b, 7c, and 7d provided on the upper and lower surfaces of the insulating plate 7a. A through hole 8 penetrating the insulating plate 7a is provided. FIG. 2 is a top view showing the insulating substrate inside the module according to the first embodiment. The conductors 7b, 7c, 7d are also wired in a planar direction on the upper and lower surfaces of the insulating plate 7a.

The conductor 7b is provided on the upper and lower surfaces of the insulating plate 7a through the through hole 8, and is connected to the upper surface electrode of the semiconductor device 3 and the conductor 2b of the insulating substrate 2 through a brazing material 9. The conductor 7c is connected to the upper surface electrode of the semiconductor device 5 through a brazing material 10. The conductor 7d is connected to the conductor 1c of the insulating substrate 1 through a brazing material 11.

Note that the brazing materials 4, 6, 9 to 11 are, for example, solder, but may be Ag paste or other conductive connecting materials. The insulating substrates 1, 2, and 7 are, for example, a printed board, a ceramic substrate with a copper pattern or the like, and may be a multilayer board.

Sealing resin 12 seals the semiconductor devices 3 and 5 and the insulating substrate 7. The lower surface of the insulating substrate 1 and the upper surface of the insulating substrate 2 located on the opposite sides to the surfaces of the insulating substrates 1 and 2 on which the semiconductor devices 3 and 5 are provided respectively are exposed from the sealing resin 12 to the outside. Heat generated by the semiconductor devices 3 and 5 also increases the temperature of the insulating substrate 7 inside the module. The insulating substrate 7 is cooled via the brazing materials 9 and 11 and the upper and lower insulating substrates 1 and 2.

The withstand voltage of the insulating plate 7a is lower than the withstand voltages of the insulating plates 1a and 2a. Here, the withstand voltage is determined by the product of the thickness of the insulating plate and the dielectric strength of the insulating plate. Therefore, when the insulating plates 1a and 2a and the insulating plate 7a are made of the same material, the thickness of the insulating plate 7a is smaller than the thicknesses of the insulating plates 1a and 2a. Alternatively, the insulating plate 7a is different in insulating material from the insulating plates 1a and 2a, and the dielectric strength of the insulating plate 7a is lower than the dielectric strengths of the insulating plates 1a and 2a.

As described above, in the present embodiment, the withstand voltage of the insulating plate 7a of the insulating substrate 7 that performs the insulation inside the module is set to be lower than the withstand voltages of the insulating plates 1a and 2a of the insulating substrates 1 and 2 that perform the insulation between the inside and outside of the module. As a result, the heat dissipation performance of the insulating plate 7a is enhanced, the material cost can be saved and the cost can be reduced.

Furthermore, by providing the semiconductor devices 3 and 5 up and down, the power can be increased and the footprint can be reduced. Since the lower surface of the insulating substrate 1 and the upper surface of the insulating substrate 2 are exposed from the sealing resin 12, the heat dissipation performance can be enhanced by double-side cooling.

In general semiconductor modules, current is taken out from the semiconductor devices 3 and 5 to an external electrode via patterns of the insulating substrates by wires. On the other hand, in the present embodiment, since the semiconductor devices 3 and 5 are connected to the insulating substrate 7 by the brazing material such as solder, it is possible to take out current in a large area. Therefore, the semiconductor devices 3 and 5 can be miniaturized, so that the semiconductor module can also be miniaturized.

Second Embodiment

Figure 3:
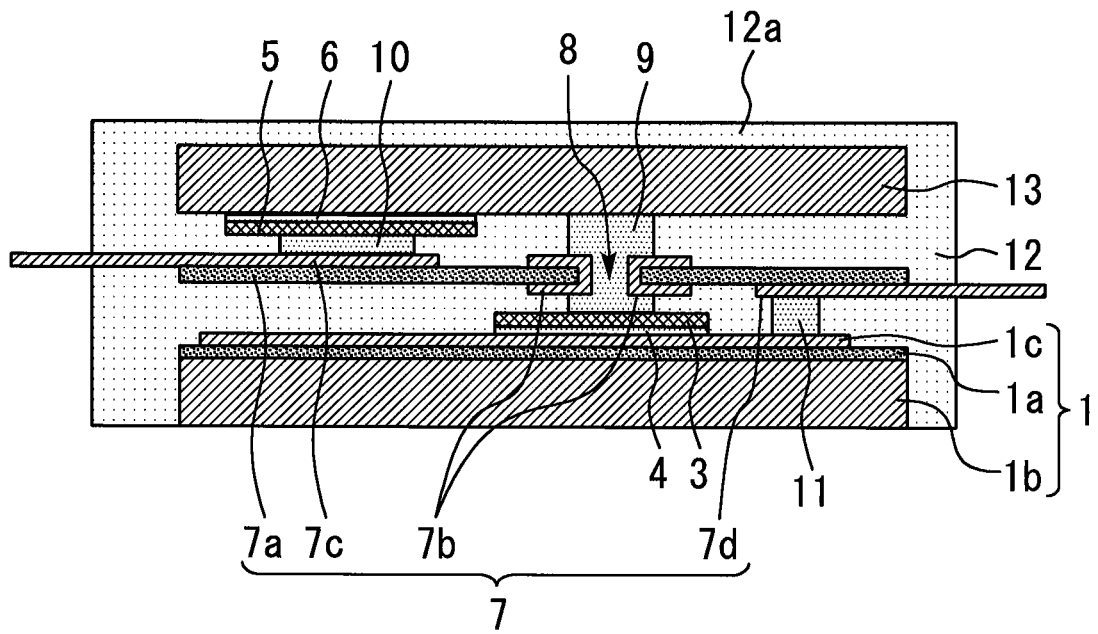
FIG. 3 is a cross-sectional view showing a semiconductor module according to a second embodiment.

FIG. 3 is a cross-sectional view showing a semiconductor module according to a second embodiment. In the present embodiment, the insulating substrate 2 of the first embodiment is changed to a metal block 13 of copper, aluminum or the like. The metal block 13 is connected to the upper surface electrode of the semiconductor device 5. A part 12a of the sealing resin 12 covers the upper surface of the metal block 13.

Figure 4:
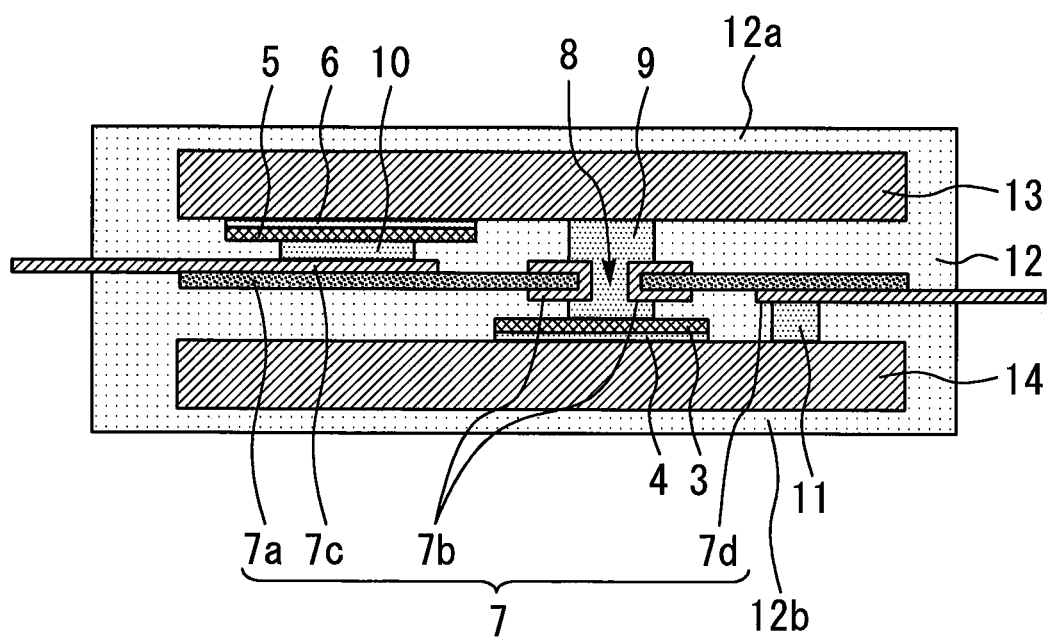
FIG. 4 is a cross-sectional view showing a modification of the semiconductor module according to the second embodiment.

FIG. 4 is a cross-sectional view showing a modification of the semiconductor module according to the second embodiment. In addition to the configuration of FIG. 3, the insulating substrate 1 of the first embodiment is changed to a metal block 14 of copper, aluminum or the like. The metal block 14 is connected to the lower surface electrode of the first semiconductor device 3. A part 12b of the sealing resin 12 covers the lower surface of the metal block 14.

In the present embodiment, the cost can be reduced by insulating the inside and outside of the module with the sealing resin 12 by using neither the insulating substrate 1 nor the insulating substrate 2. Furthermore, the withstand voltage of the insulating plate 7a of the insulating substrate 7 that performs the insulation inside the module is set to be lower than the withstand voltage of parts 12a and 12b of the sealing resin 12 that performs the insulation between the inside and outside of the module. As a result, an effect similar to the effect of the first embodiment can be obtained. Note that each of the metal blocks 13 and 14 is not limited to one metal block, and may be a plurality of metal blocks.

Third Embodiment

Figure 5:
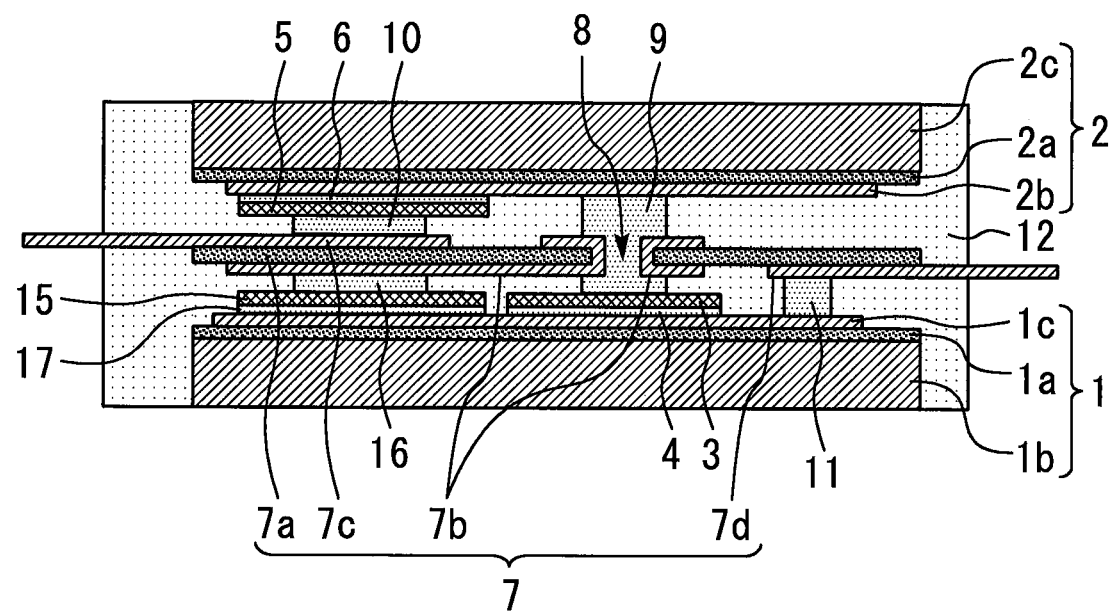
FIG. 5 is a cross-sectional view showing a semiconductor module according to a third embodiment.

FIG. 5 is a cross-sectional view showing a semiconductor module according to a third embodiment. In the present embodiment, a semiconductor device 15 is provided on the insulating substrate 7. An upper surface electrode of the semiconductor device 15 is connected to the conductor 7b of the insulating substrate 7 by a brazing material 16 such as solder, and is connected to the conductor 1c of the insulating substrate 1 by a brazing material 17. As described above, the semiconductor device 15 is also provided to the insulating substrate 7 inside the module, whereby it is possible to increase the current density of the semiconductor module. Other configurations and effects are similar to the configurations and effects of the first embodiment. Note that the insulating substrates 1 and 2 may be changed to the metal blocks 13 and 14 as in the case of the second embodiment.

Fourth Embodiment

Figure 6:
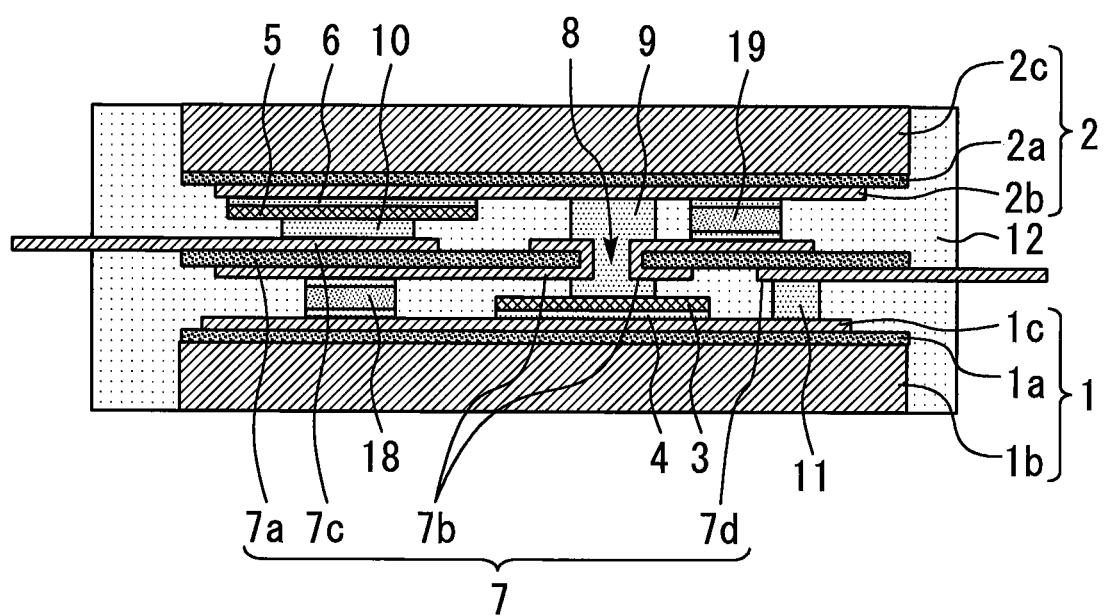
FIG. 6 is a sectional view showing a semiconductor module according to a fourth embodiment.

FIG. 6 is a sectional view showing a semiconductor module according to a fourth embodiment. A spacer 18 of metal such as copper is provided to secure a gap between the insulating substrate 1 and the insulating substrate 7. A spacer 19 of metal such as copper is provided to secure a gap between the insulating substrate 2 and the insulating substrate 7. The spacer 18 is connected to the conductors 1c and 7b of the insulating substrates 1 and 7 by a brazing material. The spacer 19 is connected to the conductors 2b and 7b of the insulating substrates 2 and 7 by a brazing material.

Stress applied to the semiconductor devices 3 and 5 can be reduced by securing the gaps with the spacers 18 and 19. Furthermore, fluidity of the sealing resin 12 can be secured. Note that the insulating substrates 1 and 2 may be changed to the metal blocks 13 and 14 as in the case of the second embodiment.

Fifth Embodiment

Figure 7:
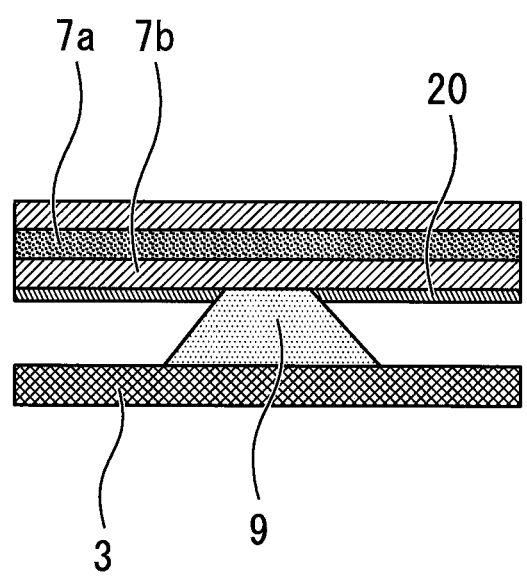
FIG. 7 is an enlarged cross-sectional view of a joint portion between a semiconductor device and an insulating substrate according to a fifth embodiment.

FIG. 7 is an enlarged cross-sectional view of a joint portion between a semiconductor device and an insulating substrate according to a fifth embodiment. In the semiconductor modules of the first to fourth embodiments, the conductor 7b of the insulating substrate 7 is provided with an insulating film 20 such as a resist for controlling a joint region with the brazing material 9. The area of the opening of the insulating film 20 is set to be smaller than the area of the upper surface electrode of the semiconductor device 3.

By controlling the joint region as described above, the brazing material 9 is shaped like a trapezoid when melted, and the connection area between the brazing material 9 and the semiconductor device 3 becomes larger than the connection area between the brazing material 9 and the conductor 7b of the insulating substrate 7. The same applies to the joint portion between the semiconductor device 5 and the insulating substrate 7. By controlling the shape of the brazing material 9 as described above, stress applied to the semiconductor devices 3 and 5 can be reduced.

The semiconductor devices 3, 5, 15 are not limited to semiconductor devices formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor device formed of such a wide-bandgap semiconductor has a high voltage resistance and a high allowable current density, and thus can be miniaturized. The use of such a miniaturized semiconductor device enables the miniaturization and high integration of the semiconductor module in which the semiconductor device is incorporated. Further, since the semiconductor device has a high heat resistance, a radiation fin of a heatsink can be miniaturized and a water-cooled part can be air-cooled, which leads to further miniaturization of the semiconductor module. Further, since the semiconductor device has a low power loss and a high efficiency, a highly efficient semiconductor module can be achieved.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2019-080267, filed on Apr. 19, 2019 including specification, claims, drawings and summary, on which the Convention priority of the present application is based, is incorporated herein by reference in its entirety.

The invention claimed is:

1. A semiconductor module comprising:
a first insulating plate;
a second insulating plate arranged above the first insulating plate;
a first semiconductor device provided on an upper surface of the first insulating plate;
a second semiconductor device provided on a lower surface of the second insulating plate;
an insulating substrate including a third insulating plate arranged between the first insulating plate and the second insulating plate, and a conductor provided on the third insulating plate and connected to the first and second semiconductor devices; and
sealing resin sealing the first and second semiconductor devices and the insulating substrate,
wherein a withstand voltage of the third insulating plate is lower than withstand voltages of the first and second insulating plates.

2. The semiconductor module according to claim 1, further comprising:
a first insulating substrate including the first insulating plate; and
a second insulating substrate including the second insulating plate,
wherein a lower surface of the first insulating substrate and an upper surface of the second insulating substrate are exposed from the sealing resin.

3. The semiconductor module according to claim 1, further comprising a first metal block connected to an upper surface of the second semiconductor device,
wherein the second insulating plate is a part of the sealing resin covering an upper surface of the first metal block.

4. The semiconductor module according to claim 1, further comprising a second metal block connected to a lower surface of the first semiconductor device,
wherein the first insulating plate is a part of the sealing resin covering a lower surface of the second metal block.

5. The semiconductor module according to claim 3, further comprising a second metal block connected to a lower surface of the first semiconductor device,
wherein the first insulating plate is a part of the sealing resin covering a lower surface of the second metal block.

6. The semiconductor module according to claim 1, further comprising a third semiconductor device provided on the insulating substrate.

7. The semiconductor module according to claim 2, further comprising a third semiconductor device provided on the insulating substrate.

8. The semiconductor module according to claim 3, further comprising a third semiconductor device provided on the insulating substrate.

9. The semiconductor module according to claim 4, further comprising a third semiconductor device provided on the insulating substrate.

10. The semiconductor module according to claim 5, further comprising a third semiconductor device provided on the insulating substrate.

11. The semiconductor module according to claim 1, further comprising a spacer provided to secure a gap between the first or second insulating plate and the insulating substrate.

12. The semiconductor module according to claim 2, further comprising a spacer provided to secure a gap between the first or second insulating plate and the insulating substrate.

13. The semiconductor module according to claim 3, further comprising a spacer provided to secure a gap between the first or second insulating plate and the insulating substrate.

14. The semiconductor module according to claim 1, further comprising a brazing material connecting the first or second semiconductor device to the conductor of the insulating substrate,
wherein a connection area between the brazing material and the first or second semiconductor device is larger than a connection area between the brazing material and the conductor of the insulating substrate.

15. The semiconductor module according to claim 2, further comprising a brazing material connecting the first or second semiconductor device to the conductor of the insulating substrate,
wherein a connection area between the brazing material and the first or second semiconductor device is larger than a connection area between the brazing material and the conductor of the insulating substrate.

16. The semiconductor module according to claim 3, further comprising a brazing material connecting the first or second semiconductor device to the conductor of the insulating substrate,
wherein a connection area between the brazing material and the first or second semiconductor device is larger than a connection area between the brazing material and the conductor of the insulating substrate.

17. The semiconductor module according to claim 1, wherein the first and second semiconductor devices are made of a wide-band-gap semiconductor.

18. The semiconductor module according to claim 2, wherein the first and second semiconductor devices are made of a wide-band-gap semiconductor.

19. The semiconductor module according to claim 3, wherein the first and second semiconductor devices are made of a wide-band-gap semiconductor.

* * * * *